United States Patent
Im

(10) Patent No.: US 12,156,460 B2
(45) Date of Patent: Nov. 26, 2024

(54) METHOD AND APPARATUS FOR MANUFACTURING ORGANIC LIGHT EMITTING DIODE FOR LIGHTING

(71) Applicant: Woo-Bin Im, Chungcheongnam-do (KR)

(72) Inventor: Woo-Bin Im, Chungcheongnam-do (KR)

(73) Assignee: LOTI CO., LTD. (KR)

( * ) Notice: Subject to any disclaimer, the term of this patent is extended or adjusted under 35 U.S.C. 154(b) by 517 days.

(21) Appl. No.: 17/599,549

(22) PCT Filed: Mar. 28, 2019

(86) PCT No.: PCT/KR2019/003666
§ 371 (c)(1),
(2) Date: Sep. 28, 2021

(87) PCT Pub. No.: WO2020/196965
PCT Pub. Date: Oct. 1, 2020

(65) Prior Publication Data
US 2022/0199961 A1 Jun. 23, 2022

(51) Int. Cl.
*H01L 51/56* (2006.01)
*H01L 21/677* (2006.01)
*H10K 71/00* (2023.01)

(52) U.S. Cl.
CPC ....... *H10K 71/00* (2023.02); *H01L 21/67706* (2013.01)

(58) Field of Classification Search
CPC ............. C23C 14/568; H01L 21/67706; H01L 21/6776; H10K 71/00
See application file for complete search history.

(56) References Cited

U.S. PATENT DOCUMENTS

| 2011/0065282 A1* | 3/2011 | Yan | H10K 71/00 257/E51.026 |
| 2012/0171359 A1* | 7/2012 | Nakai | C23C 14/042 118/721 |

(Continued)

FOREIGN PATENT DOCUMENTS

| KR | 20100117438 A | 11/2010 |
| KR | 20120071341 A | 7/2012 |

(Continued)

OTHER PUBLICATIONS

International Search Report for PCT/KR2019/003666, mailed Dec. 27, 2019.
Written Opinion for PCT/KR2019/003666, mailed Dec. 27, 2019.

*Primary Examiner* — Jaehwan Oh
(74) *Attorney, Agent, or Firm* — Renaissance IP Law Group LLP

(57) ABSTRACT

An apparatus and method for manufacturing an organic light emitting diode (OLED) for lighting are disclosed. The manufacturing apparatus includes a plurality of rolling members configured to move, in a transverse direction, a band-shaped base having holes formed at predetermined intervals at both width-direction ends thereof, and arranged at predetermined intervals along a movement direction of the base, and a deposition unit configured to discharge a vaporization material from a deposition source and sequentially depositing the discharged vaporization material on one surface of the base, along with the movement of the base. A plurality of protrusion members are formed on one surface of each of the rolling members, to move the base by being inserted in and released from the holes at both ends of the base along with rotation of the tolling members.

14 Claims, 8 Drawing Sheets

(56) References Cited

U.S. PATENT DOCUMENTS

2014/0220722 A1* 8/2014 Kakiuchi ............. H10K 71/164
  438/46
2016/0111586 A1* 4/2016 Rey-Garcia ....... H01L 21/67115
  392/417

FOREIGN PATENT DOCUMENTS

| KR | 20140073461 A | 6/2014 |
| KR | 20140139360 A | 12/2014 |
| KR | 20150138679 A | 12/2015 |

* cited by examiner

METHOD AND APPARATUS FOR MANUFACTURING ORGANIC LIGHT EMITTING DIODE FOR LIGHTING

TECHNICAL FIELD

The present disclosure relates to a method and apparatus for manufacturing an organic light emitting diode (OLED) for lighting.

BACKGROUND ART

An organic light emitting diode (OLED) is a self-luminous device that emits light through recombination of electrons and holes in an organic light emitting layer. When current is applied to the OLED, molecular excitons recombined inside the light emitting layer exist in two types: singlet excitons and triplet excitons.

25% of molecular excitons in a high energy state are singlet excitons, and 75% of molecular excitons in a low energy state are triplet excitons. As the singlet excitons and the triplet excitons fall back to a low-energy base state, they disappear while emitting light (photons) or heat. When light is generated by singlet excitons, this is called fluorescence, and when light is generated by triplet excitons, this is called phosphorescence. In the case of a fluorescent organic material, only 25% of the excitons contribute to light generation, whereas in the case of a phosphorescent organic material, light is generated by the triplet excitons corresponding to 75% of the excitons. As the singlet excitons corresponding to the remaining 25% also contribute to the light generation along with transfer of energy to the triplet excitons through an intersystem crossing (ISC) path, 100% of the excitons contribute as light energy.

Since OLEDs were implemented in 1987, commercial OLED products have appeared in the fields of displays and lighting owing to dramatic developments such as organic substance development, organic material development, charge transfer improvement, transparent electrode improvement, and light extraction structure development. Particularly, as the use of incandescent lamps and fluorescent lamps is regulated due to an energy saving promotion policy, OLED light sources have been attracting interest. In addition, the OLED light sources are environmentally friendly because heavy metals such as mercury and lead are not used.

Generally, vacuum deposition or coating is known as a method of manufacturing an OLED. Due to the benefits of increased purity of the materials of constituent layers and a long lifetime of manufactured OLEDs, vacuum deposition is mainly used. In the vacuum deposition method, the constituent layers are formed by deposition using a deposition source provided at a position facing a base in a vacuum chamber. As a flat glass substrate is used in this existing OLED manufacturing process, the size of the equipment increases for a lager substrate. The resulting increase of the investment cost of facilities such as devices and clean rooms acts as a price increase factor. Because price competitiveness is the key to lighting products, to produce large quantities in a small clean room is a challenging issue. For this purpose, a roll process is employed in the OLED manufacturing process. The roll process is a process of continuously unwinding a base wound up in the shape of a roll and rewinding the unwound base on the other side, to continuously deposit the constituent layers on the base, while moving the base.

In the roll process, when deposition source are arranged disposed above the base, and the constituent layers are formed by discharging a vaporization material downward from the deposition sources toward the base, a foreign material such as dust may fall from the deposition sources, adhere to the base, and mix into an OLED. The introduction of the foreign material into the OLED adversely affects light emission from the OLED. Therefore, to suppress the introduction of a foreign material, the deposition sources are arranged under the base. However, since the OLED is formed by stacking a plurality of constituent layers, if all of the constituent layers are to be sequentially formed by deposition from below, the base needs to pass above all of the deposition sources.

In this case, since the base passes above the deposition sources over a long area, it becomes difficult to apply sufficient tension to the base, and thus the base is vulnerable to warpage or vibration. When the deposition surface of the base and the deposition sources come into contact due to the warpage or vibration of the base, the base or the constituent layers formed on the base may be damaged. Moreover, when the distances between the base and the deposition sources change, it is difficult to appropriately control the thicknesses of the constituent layers, and the constituent layers may not have desired light emission properties. In addition, when the amount of tension is increased to provide sufficient tension to the base, a stretching force acts on the base. In the case of a flexible substrate, the base may be stretched and thus deformed. For this reason, a problem may occur in forming a deposited film in a desired area. Moreover, when the roll process is performed on thin glass, excessive tension may cause damage to the substrate, making it impossible to manufacture a normal product.

DISCLOSURE

Technical Problem

An aspect of the present disclosure devised to solve the above problem is to provide an apparatus and method for manufacturing an organic light emitting diode (OLED) for which a quality decrease is suppressed. It will be appreciated by persons skilled in the art that the objects that could be achieved with the present disclosure are not limited to what has been particularly described hereinabove and the above and other objects that the present disclosure could achieve will be more clearly understood from the following detailed description.

Technical Solution

In an aspect of the present disclosure, an apparatus for manufacturing an organic light emitting diode (OLED) for lighting includes a plurality of rolling members configured to move, in a transverse direction, a band-shaped base having holes formed at predetermined intervals at both width-direction ends thereof, and arranged at predetermined intervals along a movement direction of the base, and a deposition unit configured to discharge a vaporization material from a deposition source and sequentially depositing the discharged vaporization material on one surface of the base, along with the movement of the base. A plurality of protrusion members are formed on one surface of each of the rolling members, to move the base by being inserted in and released from the holes at both ends of the base along with rotation of the tolling members.

According to another aspect of the present disclosure, a method of manufacturing an OLED for lighting includes supplying a band-shaped base having holes formed at predetermined intervals at both width-direction ends thereof to a deposition unit, and moving the base in a transverse direction by a plurality of rolling members arranged at predetermined intervals along a movement direction of the base, discharging a vaporization material from a deposition source, and sequentially depositing the discharged vaporization material on one surface of the base, along with the movement of the base. The sequential deposition includes moving the base by inserting and releasing a plurality of protrusion members formed on one surface of each of the rolling members in and from the holes at both ends of the base, along with rotation of the rolling members.

Advantageous Effects

According to the above various embodiments, as sufficient tension is applied to a base, warpage or vibration of the base may be prevented. Further, the use of a shield member and a base formed to contain magnetic materials may minimize a quality decrease caused by contamination and sagging of the base.

Figure 1:
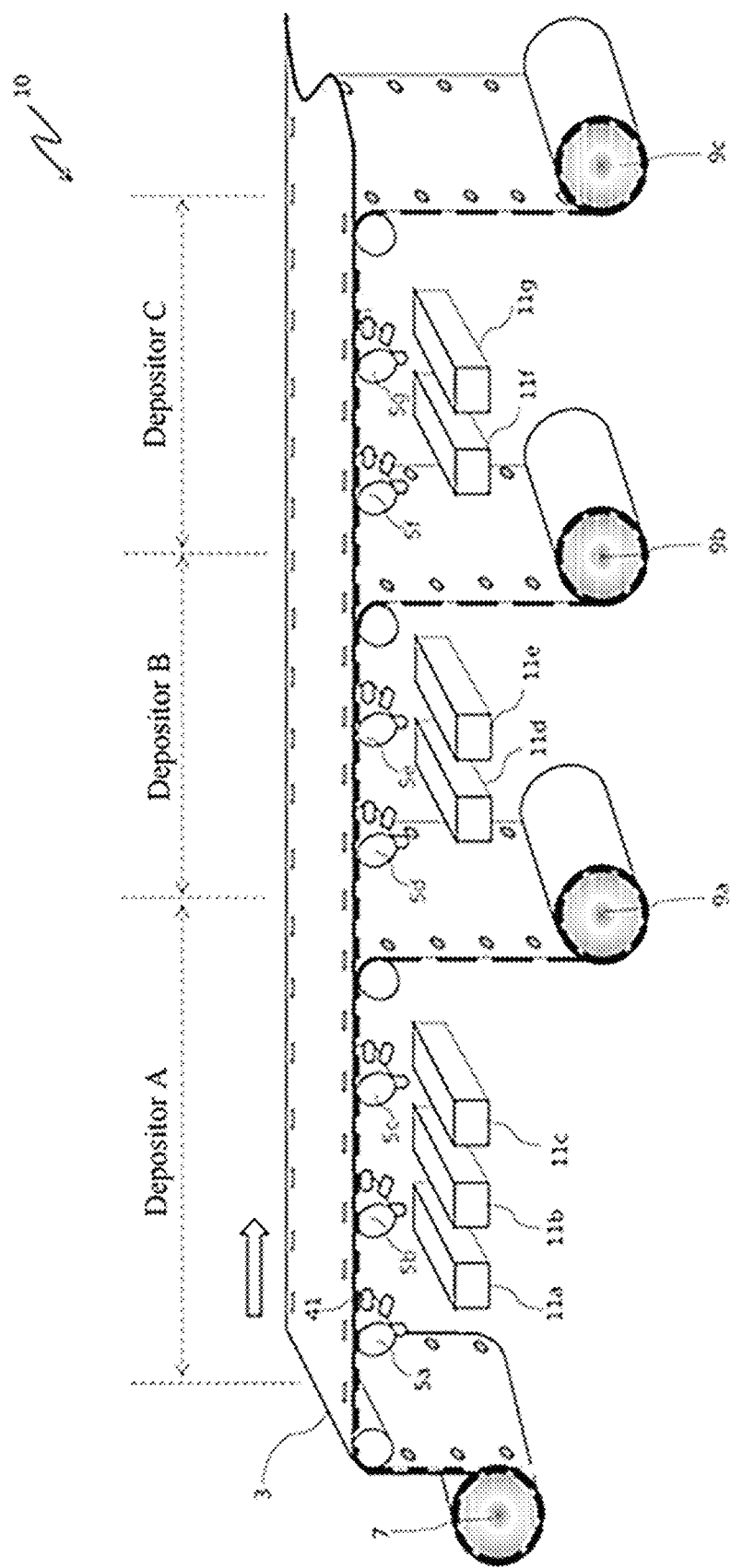
FIG. 1 illustrates an apparatus for manufacturing an organic light emitting diode (LED) for lighting according to an embodiment of the present disclosure.

DESCRIPTION OF REFERENCE NUMERALS
OF COMPONENTS IN THE DRAWINGS

10: manufacturing apparatus 3: base
5 (5a to 5g): rolling member 7: base supply unit
9 (9a, 9b and 9c): mask retrieval unit 11a to 11g: deposition source
21: support film 22: glass substrate
23: encapsulation shadow mask 24: cathode shadow mask
25: organic shadow mask 41: protrusion member
43: driving unit 47: first connection member
29: second connection member 10a: manufacturing apparatus
61: shield member 71, 72: magnetic material

DETAILED DESCRIPTION

Embodiments of the present disclosure will be described in detail with reference to the accompanying drawings so that those skilled in the art can easily implement them. However, the present disclosure may be implemented in various different forms, not limited to the embodiments described herein. To clarify the present disclosure in the drawings, parts irrelevant to the description are not shown, and like reference numerals denote similar components throughout the specification.

In a description given with reference to the drawings, different reference numerals may be assigned even to a component with the same name according to the drawings. The reference numerals are only written for convenience of description, and the concept, feature, function, or effect of each component is not restrictively interpreted by a corresponding reference numeral.

Throughout the specification, when it is said that a component is "connected" to another component, this includes not only "directly connected" but also "electrically connected" with any other component in between. Further, when it is said that a part "includes" a component, it means that any other component may be further included, rather than other components are excluded, unless otherwise stated, and should be understood that the existence or addition of one or more other numbers, steps, operations, components, parts, or combinations thereof is not excluded in advance.

Throughout this specification, the term "organic" includes a polymeric material as well as a small molecule organic material available for fabrication of an organic optoelectronic device.

Throughout the specification, when it is said that a part "includes" a component, it means that any other component may be further included, rather than other components are excluded, unless otherwise stated. As used herein, the terms "about" and "substantially" are defined as being or being close to a numerical value, when a manufacturing and material tolerance inherent in a stated meaning is presented, and are used to prevent an unscrupulous infringer from using the disclosure in which exact or absolute values are mentioned for better understanding. As used throughout the specification, the term "step (to)" or "step of" does not mean "step for".

An embodiment of the present disclosure will be described in detail with reference to the attached drawings.

FIG. 1 illustrates an apparatus 10 for manufacturing an organic light emitting diode (OLED) for lighting according to an embodiment of the present disclosure. The manufacturing apparatus 10 according to the embodiment of the present disclosure is configured to manufacture an OLED for lighting on a band-shaped base 3 by deposition, while moving the base 3 in a transverse direction.

As illustrated in FIG. 1, the manufacturing apparatus 10 includes depositors A, B and C for sequentially performing deposition by discharging a vaporization material from deposition sources under the base 3 in the transverse direction, and rolling members (see FIGS. 5a to 5g, which are collectively referred to as FIG. 5) for moving the base 3 in the transverse direction.

First, the base 3 is shaped into a band with holes formed at predetermined intervals at both width-direction ends thereof, includes a plurality of layers bonded to each other, and is fed to the depositors A, B and C by a base supply unit 7 including a base supply. The base supply may be, for example, an unwinder that unwinds the band-shaped base 3 wound in the form of a roll. The base 3 will be described in detail with reference to FIGS. 2 and 3.

The depositors A, B and C are sequentially arranged along a movement direction (an arrowed direction) of the base 3, in the order of the depositor A for depositing an organic material, the depositor B for depositing a cathode material, and the depositor C for depositing an encapsulation material in a thin film encapsulation (TFE) scheme or a hybrid scheme. The depositors A, B and C include deposition sources 11a to 11g under the moving base 3. As the base 3 moves with its deposition surface facing downward, the depositors A, B and C discharge the vaporization material from the deposition sources 11a to 11g to the deposition surface, for deposition.

The deposition sources 11a to 11g may be arranged such that an opening of each deposition source faces the deposition surface of the base 3. Each of the deposition sources 11a to 11g includes a heater (not shown), and the heater vaporizes a material contained in each deposition source by heating the material, and discharges the vaporized material upward from the opening. One or more deposition sources are disposed in each of the depositors A, B and C depending on layers to be formed, not limited to the embodiment of FIG. 1.

In addition, although each of the deposition sources 11a to 11g is shown as being disposed under the base 3 in FIG. 1, the deposition sources may be disposed above or beside the base 3 according to an implementation example. When the deposition sources are disposed on one side of the base 3, the base 3 may be configured to move in the transverse direction, while standing vertically.

While not shown in FIG. 1, the manufacturing apparatus 10 includes a plurality of vacuum chambers. In each vacuum chamber, the base supply unit 7, the depositor A, the depositor B, the depositor C, and rolling members 5 are arranged. The inside of each vacuum chamber is made into a pressure-reduced state by a vacuum generator, and a vacuum area is formed in the inside of the vacuum chamber.

Further, adjacent vacuum chambers communicate with each other through an opening, while being maintained in a vacuum state. In addition, the base 3 may be sequentially moved from the base supply unit 7 through the opening along with driving of the rolling members 5. Specifically, the base 3 drawn out from the base supply unit 7 is moved to the depositor A, the depositor B, and the depositor C.

Figure 2:
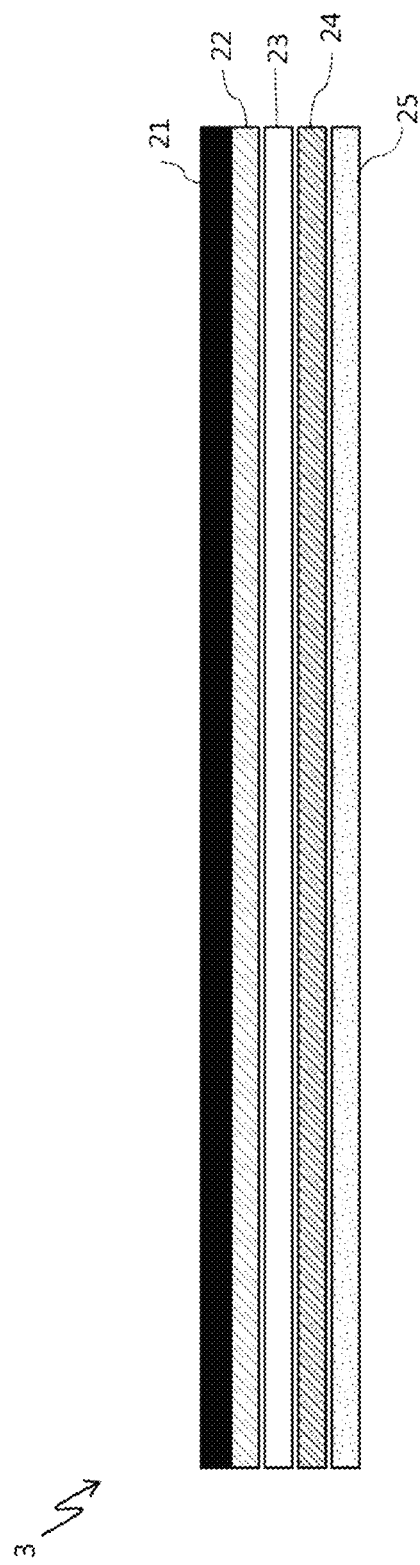
FIG. 2 illustrates the structure of a base according to an embodiment of the present disclosure.

FIG. 2 illustrates the configuration of the base 3 according to an embodiment of the present disclosure.

As illustrated in FIG. 2, the base 3 is configured by sequentially laminating a plurality of materials. Specifically, the base may include an anode-treated (e.g., indium tin oxide (ITO)-coated) glass substrate 22, a support film 21 bonded to the top of the glass substrate 22 to support the glass substrate 22, and a plurality of shadow masks 23, 24 and 25 bonded to the bottom of the glass substrate 22.

The plurality of shadow masks 23, 24, and 25 include an encapsulation shadow mask 23 used in the depositor C, a cathode shadow mask 24 used in the depositor B, and an organic shadow mask 25 used in the depositor A. The shadow masks 23, 24 and 25 may be sequentially bonded to the base 3, starting from the last shadow mask (i.e., the encapsulation shadow mask 23) to be used.

In addition, the shadow masks 23, 24 and 25 are sequentially removed and retrieved by mask retrieval units 9a, 9b, and 9c each being provided with a mask retriever, disposed at the ends of the respective depositors A, B and C. The mask retriever may be, but not limited to, a winder.

The width, thickness, or length of the base 3 may be variously set according to the size of a substrate for OLEDs which is formed on the base 3.

Referring back to FIG. 1, holes 31a and 31b are formed at predetermined at both width-direction ends of the base 3.

Figure 3:
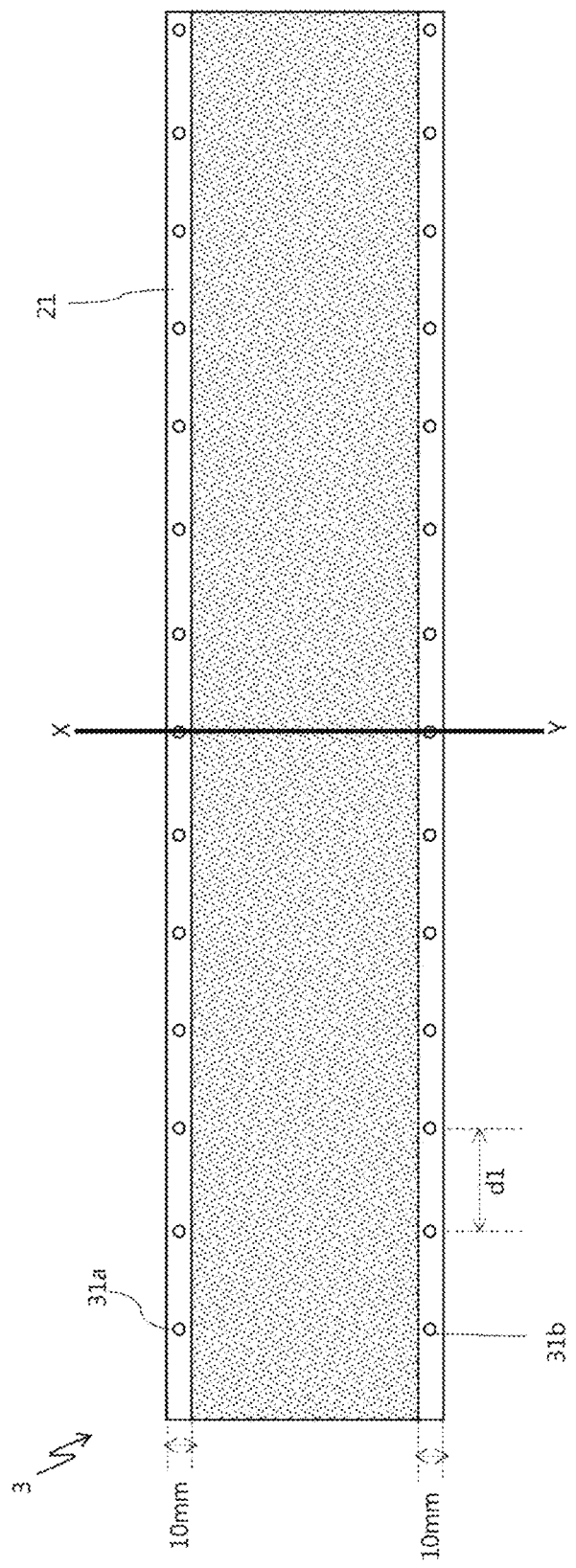
FIG. 3 is a top view illustrating the base according to an embodiment of the present disclosure.
Figure 4:
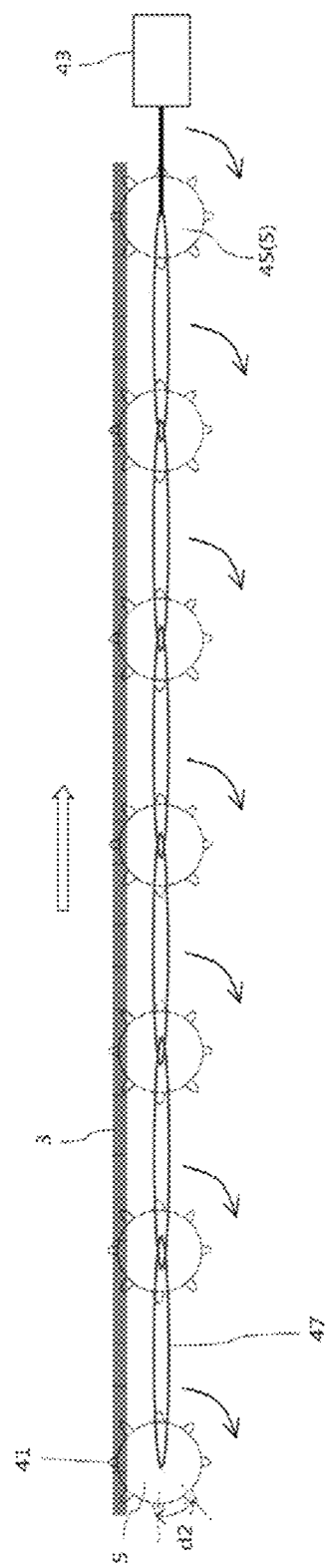
FIG. 4 is a side view illustrating rolling members arranged under the base according to an embodiment of the present disclosure.

FIG. 3 is a top view illustrating the base 3, and FIG. 4 is a side view illustrating the rolling members arranged under the base 3. Referring to FIGS. 3 and 4, protrusion members 41 protrude outward from one surface of each of the rolling members 5 and are temporarily fit into the holes of the base 3. Each hole of the base 3 may be formed based on a distance between the protrusion members formed on each rolling member. That is, a length-direction distance d1 between two holes coincides with a circumferential distance d2 between the ends of two protrusion members. Accordingly, as the rolling members 5 are driven, the protrusion members 41 formed on the rolling members 5 are repeatedly inserted into and released from the holes 31a and 31b of the base 3, thus moving the base 3.

A plurality of rolling members 5 rotate at the same angular velocity. For this purpose, the manufacturing apparatus 10 may include a driving unit 43 coupled to one of the plurality of rolling members 5 to rotate the corresponding rolling member 45. The driving unit 43 may be a motor or the like.

The manufacturing apparatus 10 may further include a first connection member 47 connecting rolling members arranged along the length direction of the base 3, and a second connection member (51 in FIG. 5) connecting two or more rolling members disposed at both width-direction ends of the base 3. Specifically, the rolling members arranged along the length direction of the base 3 rotate together by receiving a driving force from the driving unit 43 coupled to one rolling member 45 through the first connection member 47. In addition, a rolling member disposed at one end of the base 3 is connected to a rolling member disposed at the other end of the base 3 by the second connection member 51 and rotate together. However, the present disclosure is not limited thereto, and the manufacturing apparatus 10 may rotate the plurality of rolling members 5 at the same angular velocity by means of two or more driving units.

Figure 5:
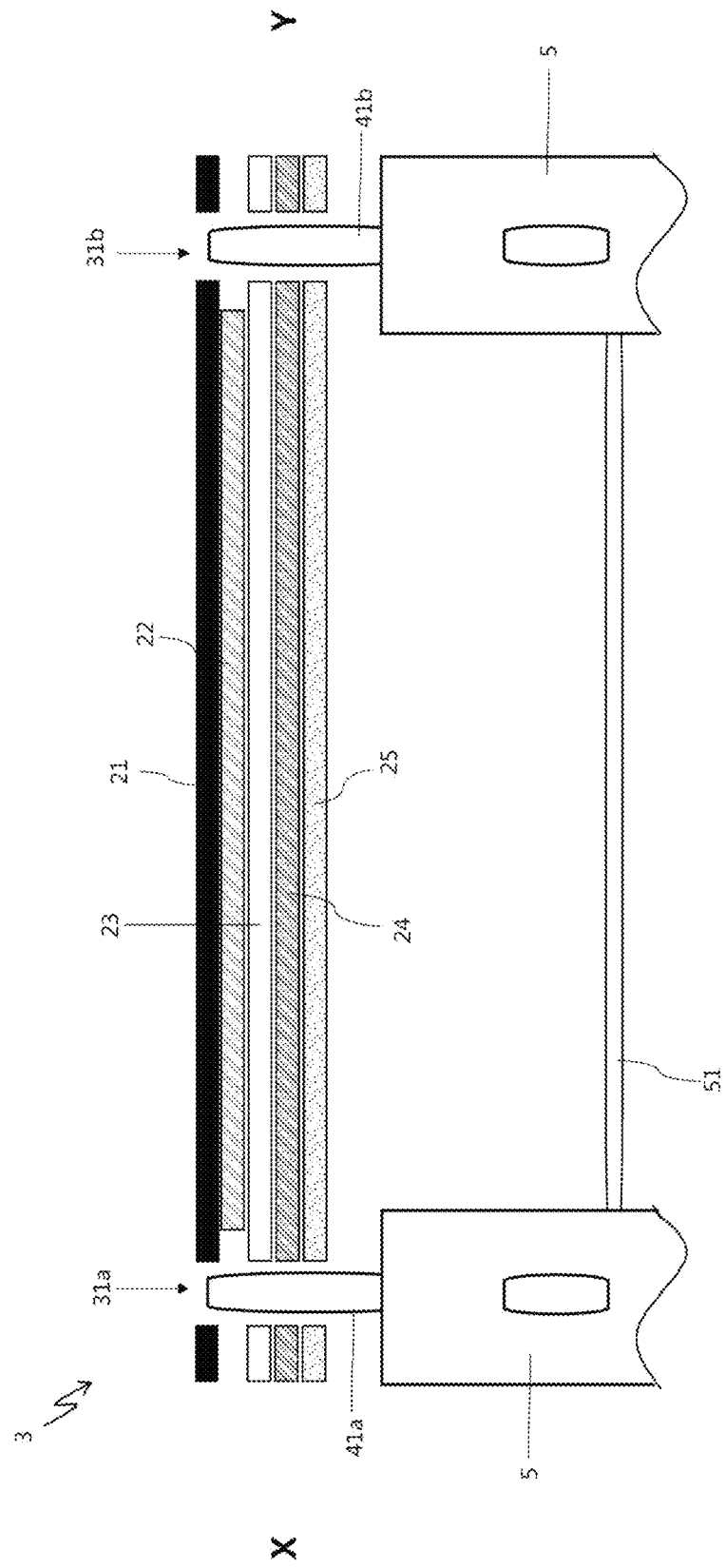
FIG. 5 is a sectional view illustrating the base of FIG. 3, taken along line X-Y.

The holes 31a and 31b are formed on the support film 21 and the plurality of shadow masks 23, 24, 25, except for the glass substrate 22. FIG. 5 is a sectional view illustrating the base 3, taken along line X-Y in FIG. 3, in which the protrusion members 51 formed on the rolling members 5 are temporarily inserted into the holes 31a and 31b.

As illustrated in FIG. 5, the glass substrate 22 is formed to have a width less than the distance between the holes 31a and 31b formed at both ends of the base 3, and thus less than those of the other layers.

For example, the glass substrate 22 has a width about 20 mm less than those of the other layers. Therefore, the holes are formed only on the non-deposition surface of the base 3, thereby preventing damage to the deposition surface of the base 3.

The holes 31a and 31b formed at both ends of the base 3 are aligned in the width direction of the base 3, and thus the two rolling members 41a and 41b with rotation shafts connected by the connection member 51 move the base 3 in the transverse direction, while being repeatedly inserted in and released from the holes 31a and 31b. Further, since the base 3 moves in an aligned state by rolling members 41a and 41b connected by the connection member 51, each of the depositors A, B and C may skip an operation of aligning the base 3 (e.g., an operation of winding the base, unwinding the wound base, and feeding the base to each depositor). Further, the plurality of rolling members 5 are arranged at predetermined intervals along the base 3, and thus the resulting application of sufficient tension to the base 3 prevents the base 3 from bending or vibrating.

The manufacturing apparatus 10 may further include a punching unit (not shown) having a puncher for punching holes on the base before the base is fed to the depositor A. The punching unit (not shown) may be disposed at the front end of the base supply unit 7 and punch both ends of the base 3 at predetermined intervals. The punching unit (not shown) may punch the base 3 to which all layers are bonded or the remaining individual layers except for the glass substrate 22 (that is, the support film 21 and the plurality of shadow masks 23, 24 and 25). In the former case, the punching unit may be disposed at the rear end of a bonding unit (not shown) for bonding the layers of the base 3, whereas in the latter case, the punching unit may be disposed at the front end of the bonding unit.

Figure 6:
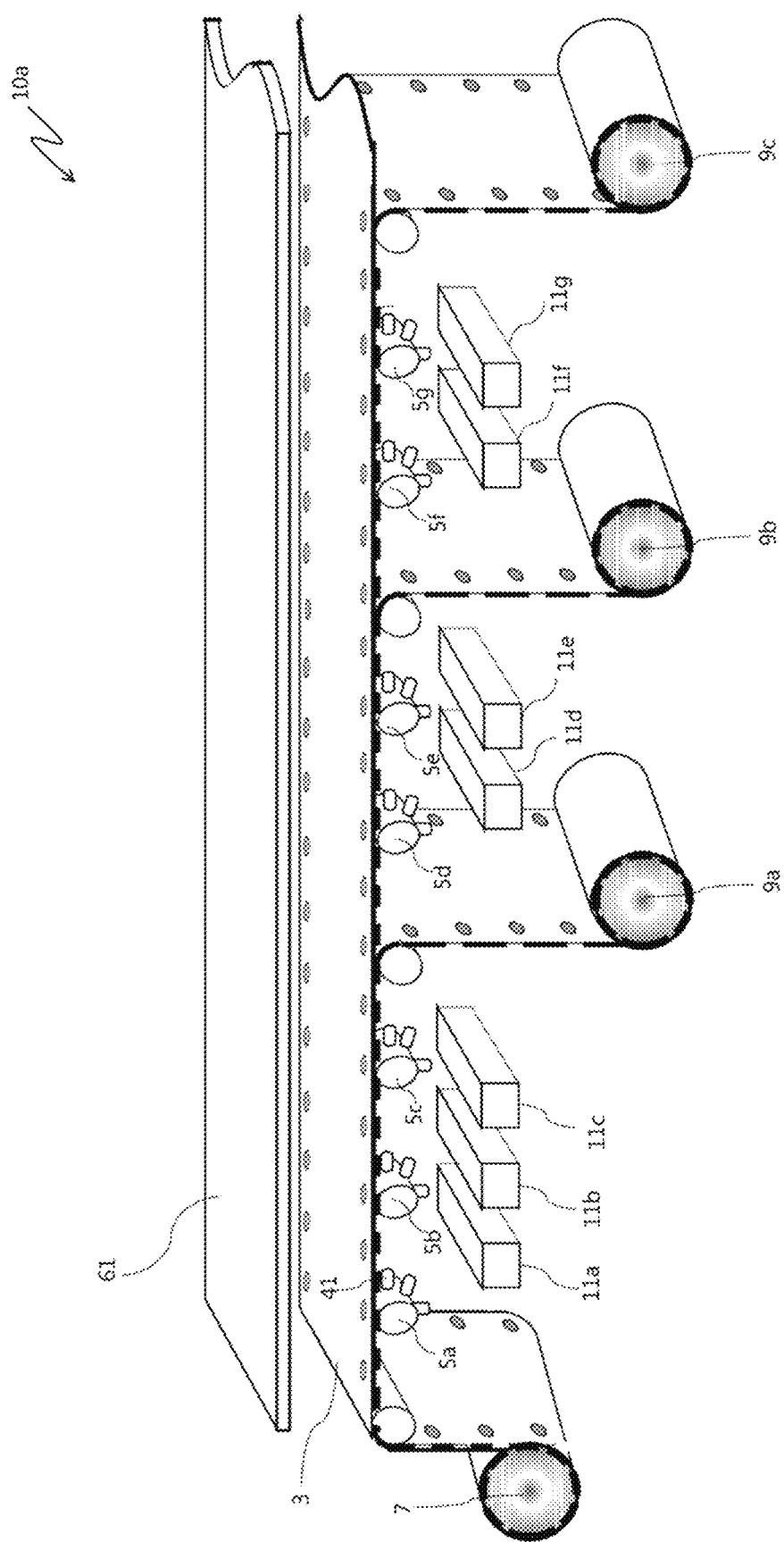
FIG. 6 illustrates the configuration of an apparatus for manufacturing an OLED for lighting according to another embodiment of the present disclosure.

FIG. 6 illustrates the configuration of an apparatus 10a for manufacturing an OLED for lighting according to another embodiment of the present disclosure.

As illustrated in FIG. 6, the manufacturing apparatus 10a according to another embodiment of the present disclosure further includes a shield member 61 disposed above the base 3 with a predetermined space in between within the depositors A, B and C, in addition to the depositors A, B and C, the plurality of rolling members 5, the base supply unit 7, and the mask retrieval units 9 illustrated in FIG. 1. The shield member 61 may be fixed to a deposition chamber (not shown) with a predetermined space (e.g., a space about 100 nm long) between the shield member 61 and the base 3, to prevent contamination of the base 3. Further, the shield member 61 may prevent the center of the base 3 not supported by the rolling members 5 from sagging as the width of the base 3 increases, thereby preventing poor material deposition. This will be described in detail with reference to FIG. 7.

Figure 7:
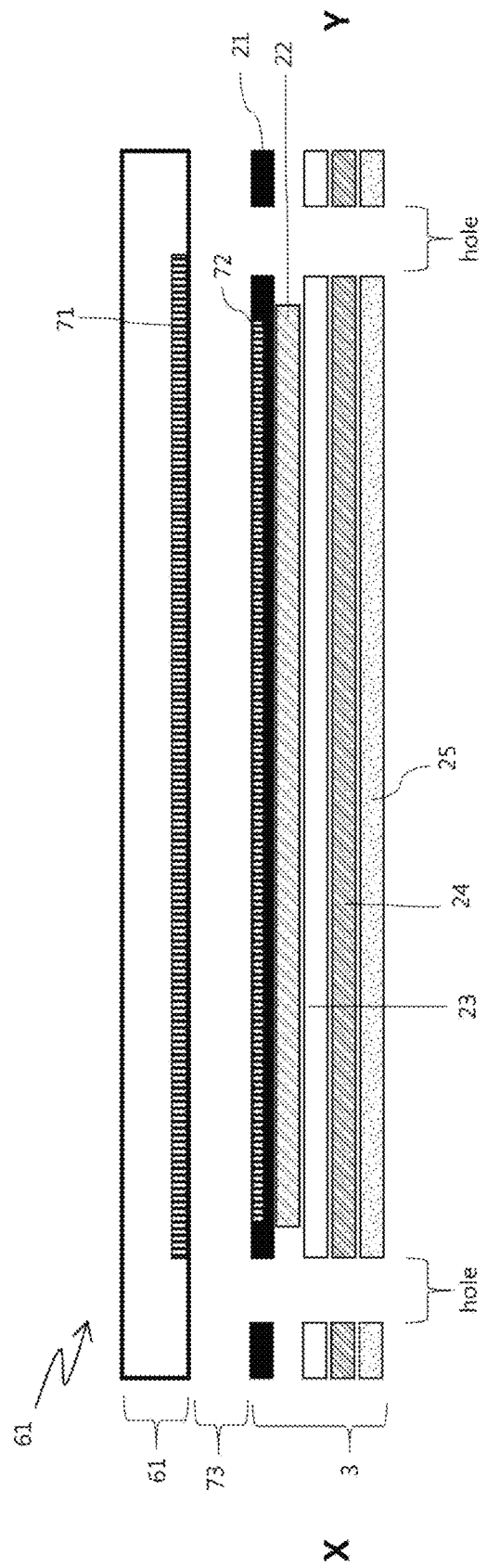
FIG. 7 illustrates the configurations of a shield member and a base according to another embodiment of the present disclosure.

FIG. 7 illustrates the configurations of the shield member 61 and the base 3 according to another embodiment of the present disclosure.

Referring to FIG. 7, the shield member 61 and the base 3 may be formed of magnetic materials 71 and 72, respectively. In this case, the magnetic materials may include, but not limited to, nickel (Ni), iron (Fe), cobalt (Co), or the like. The magnetic material 72 of the base 3 may be formed on the support film 21. A controller (not shown) provided in the manufacturing apparatus 10 may control current to flow in the magnetic materials 71 and 72 of the shield member 61 and the base 3 in different directions, so that an attractive force may be applied between the shield member 61 and the support film 21. In this case, the controller (not shown) may adjust the intensity of the current to maintain a predetermined space 73 between the shield member 61 and the base 3.

Alternatively, according to an implementation example, the predetermined space may be maintained between the base 3 and the shield member by forming the shield member of a magnetic material having a magnetic force. In this case, the space may be maintained between the magnetic material and the base 3 by changing the amount of the magnetic material contained in the shield member (e.g., the thickness of the shield member).

Further, the magnetic materials 71 and 72 may be formed apart from each other by a predetermined distance in the shield member 61 and the base 3, and may be partially formed at the center of the base 3.

As such, the manufacturing apparatus 10a according to another embodiment of the present disclosure further includes the shield member 61. Therefore, a quality decrease caused by contamination, sagging, and so on of the base may be minimized.

Figure 8:
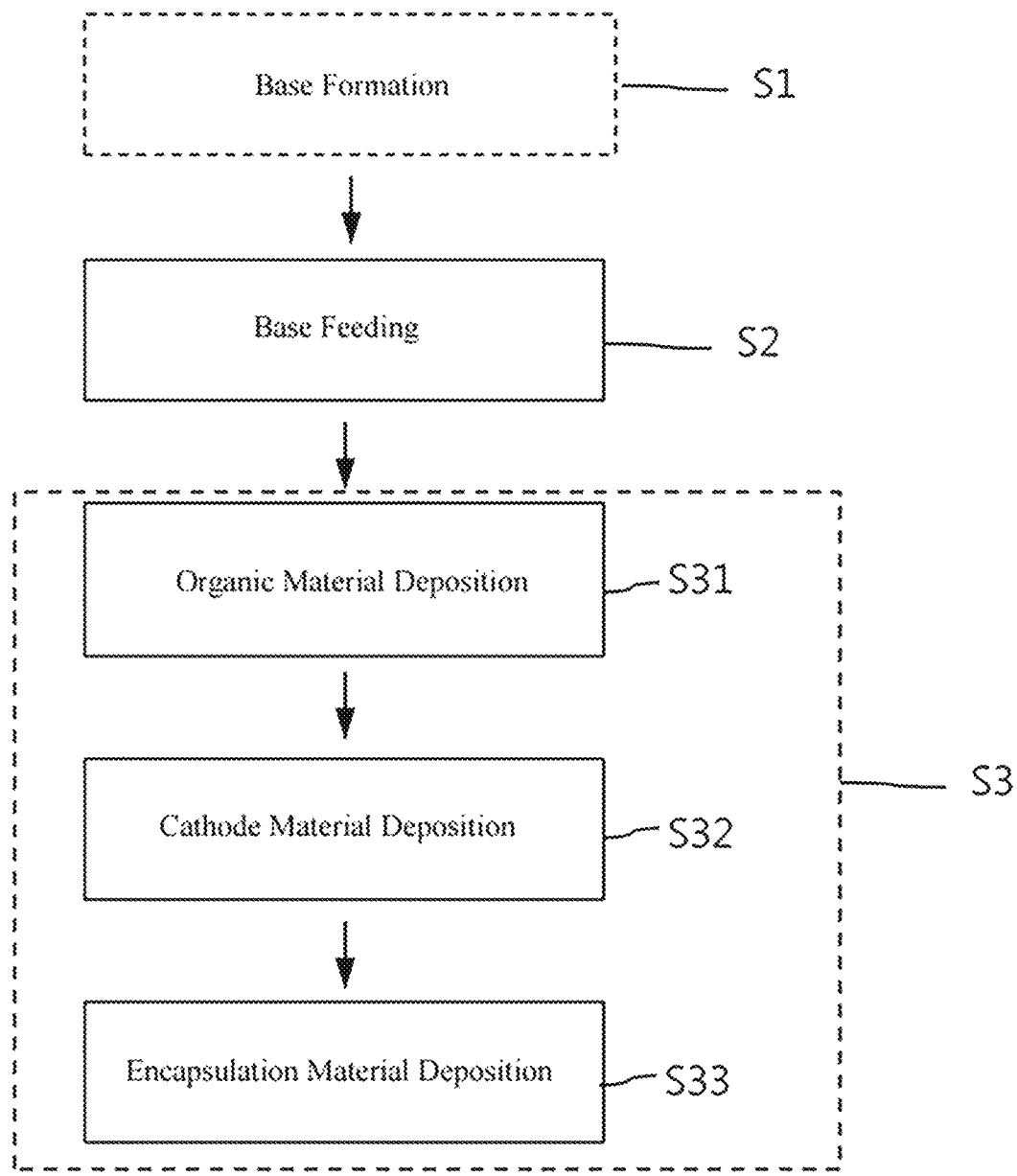
FIG. 8 illustrates a method of manufacturing an OLED for lighting according to an embodiment of the present disclosure.

FIG. 8 is a flowchart illustrating a method 80 of manufacturing an OLED for lighting according to an embodiment of the present disclosure. The manufacturing method 80 of FIG. 8 is related to the embodiments described above with reference to FIGS. 1 to 7. Accordingly, the foregoing descriptions given with reference to FIGS. 1 to 7 may be applied to the manufacturing method 80 of FIG. 8, although not described herein.

First, a base is formed (S1). Specifically, a support film may be bonded to the top of a glass substrate by a bonding unit in order to support the glass substrate, and a plurality of shadow masks may be sequentially bonded to the bottom of the glass substrate. The plurality of shadow masks may be sequentially bonded to the glass substrate, starting from the last shadow mask to be used according to a movement direction of the base.

Holes are formed at predetermined intervals at both ends of the base by punching the bonded base at the predetermined intervals. The glass substrate is formed to have a width less than the distance between the holes formed at both ends of the base. Therefore, even though the holes are punched on the base, the holes are not formed on the glass substrate, as illustrated in FIG. 5.

However, the above-described step S1 is not essential to the manufacturing method 80 according to an embodiment of the present disclosure, and thus may be omitted. In this case, the based formed in the above manner may be provided from the outside.

Then, the base is fed to a deposition unit (S2).

The base is then moved in the transverse direction by a plurality of rolling members arranged at predetermined intervals according to a movement direction of the base, and along with the movement of the base, a vaporization material is sequentially discharged from deposition sources and deposited on one surface of the base (S3). Specifically, a first deposition process S31 of depositing an organic material, a second deposition process S32 of depositing a cathode material, and a third deposition process S33 of depositing an encapsulation material are sequentially performed. In each of the first, second and third deposition processes S31 to S33, shadow masks bonded to the lowermost part of the base may be retrieved.

A plurality of rolling members may be interconnected by connection members and rotate at a predetermined angular velocity by one driving unit, thereby moving the base at a predetermined velocity.

According to an implementation example, each of the deposition processes S31, S32 and S33 may be controlled such that current flows in opposite directions through magnetic materials contained respectively in the base and a shield member disposed above the base with a predetermined space in between. This operation may be performed by the controller (not shown) provided in the manufacturing apparatus 10a.

The above description of the present disclosure is given for illustrative purposes, and Those skilled in the art will appreciate that the disclosure may be carried out in other specific ways than those set forth herein without departing from the spirit and essential characteristics of the disclosure. The above embodiments are therefore to be construed in all aspects as illustrative and not restrictive. For example, each component described as a single one may be distributed and components described as distributed may be combined.

The scope of the disclosure should be determined by the appended claims and their legal equivalents, not by the above description, and all changes coming within the meaning and equivalency range of the appended claims are intended to be embraced therein.

Those skilled in the art will appreciate that the present disclosure may be carried out in other specific ways than those set forth herein without departing from the spirit and essential characteristics of the present disclosure. The above embodiments are therefore to be construed in all aspects as illustrative and not restrictive. The scope of the disclosure should be determined by the appended claims and their legal equivalents, not by the above description, and all changes coming within the meaning and equivalency range of the appended claims are intended to be embraced therein.

The invention claimed is:

1. An apparatus for manufacturing an organic light emitting diode (OLED) for lighting, the apparatus comprising:
   a plurality of rolling members configured to move, in a transverse direction, a band-shaped base having holes formed at predetermined intervals at both width-direction ends thereof, and arranged at predetermined intervals along a movement direction of the base; and
   a deposition unit configured to discharge a vaporization material from a deposition source and sequentially depositing the discharged vaporization material on one surface of the base, along with the movement of the base,
   wherein a plurality of protrusion members are formed on one surface of each of the rolling members, to move the base by being inserted in and released from the holes at both ends of the base along with rotation of the rolling members,
   wherein the base is formed to include a glass substrate, a support film bonded to a top of the glass substrate to support the glass substrate, a plurality of shadow masks bonded to a bottom of the glass substrate,
   wherein the deposition unit comprises a first depositor configured to deposit an organic material on the base, a second depositor configured to deposit a cathode material on the base, a third depositor configured to deposit an encapsulation material on the base and a mask retrieval unit disposed at each of the first, second, and third depositors, and configured to retrieve a shadow mask bonded to a lowest part of the base,
   wherein the plurality of shadow masks include an encapsulation shadow mask used in the third depositor, a cathode shadow mask used in the second depositor, and an organic shadow mask used in the first depositor and the plurality of shadow masks are sequentially bonded to the base, starting from the encapsulation shadow mask to be used lastly along a movement direction of the base.

2. The apparatus according to claim 1, further comprising a driving unit coupled to one of the plurality of rolling members and configured to rotate the one rolling member.

3. The apparatus according to claim 2, further comprising:
   a first connection member connecting a plurality of rolling members arranged in a length direction of the base; and
   a second connection member connecting rotation shafts of at least two rolling members arranged at both width-direction ends of the base.

4. The apparatus according to claim 1, wherein the glass substrate is formed to have a width less than a distance between holes formed at both ends of the base.

5. The apparatus according to claim 1, further comprising a punching unit including a puncher configured to punch the holes on the base before the base is provided to the deposition unit.

6. The apparatus according to claim 1, wherein the deposition unit further comprises a shield member disposed above the base with a predetermined space defined between the shield member and the base.

7. The apparatus according to claim 6, wherein each of the shield member and the base is formed of a material containing a magnetic material.

8. The apparatus according to claim 7, wherein the magnetic material is formed on the support film of the base.

9. The apparatus according to claim 7, further comprising a controller configured to control current to flow in different directions in the shield member and the base,
   wherein the controller is configured to adjust an intensity of the current to have the predetermined space between the shield member and the base.

10. The apparatus according to claim 6, wherein the shield member is formed of a material containing a magnet material, and the base is formed of a material containing a magnetic material.

11. A method of manufacturing an organic light emitting diode (OLED) for lighting, the method comprising:
    bonding a support film to a top of a glass substrate to support the glass substrate;
    sequentially bonding a plurality of shadow masks to a bottom of the glass substrate;
    supplying a band-shaped base having holes formed at predetermined intervals at both width-direction ends thereof to a deposition unit; and
    moving the base in a transverse direction by a plurality of rolling members arranged at predetermined intervals along a movement direction of the base, discharging a vaporization material from a deposition source, and sequentially depositing the discharged vaporization material on one surface of the base, along with the movement of the base,
    wherein the sequentially depositing comprises moving the base by inserting and releasing a plurality of protrusion members formed on one surface of each of the rolling members in and from the holes at both ends of the base, along with rotation of the rolling members,
    wherein the sequentially depositing comprises sequentially performing a first deposition process of depositing an organic material, a second deposition process of depositing a cathode material, and a third deposition process of depositing an encapsulation material, along the movement direction of the base, and
    wherein the plurality of shadow masks include an encapsulation shadow mask used in the third deposition process, a cathode shadow mask used in the second deposition process, and an organic shadow mask used in the first deposition process and the plurality of shadow masks are sequentially bonded to the base, starting from the encapsulation shadow mask to be used lastly along a movement direction of the base.

12. The method according to claim 11, wherein the glass substrate is formed to have a width less than a distance between holes formed at both ends of the base.

13. The method according to claim 11, further comprising punching the holes on the base before the base is supplied.

14. The method according to claim 11, wherein the sequentially depositing further comprises controlling current to flow in different directions in magnetic materials included respectively in the base and a shield member disposed above the base with a predetermined space in between.

* * * * *